United States Patent
Gorshe

(10) Patent No.: US 10,355,823 B2
(45) Date of Patent: *Jul. 16, 2019

(54) SYSTEM AND METHOD FOR BLOCK-CODING TRANSCODING

(71) Applicant: Microsemi Storage Solutions, Inc., Aliso Viejo, CA (US)

(72) Inventor: Steven Scott Gorshe, Beaverton, OR (US)

(73) Assignee: Microsemi Storage Solutions, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,917

(22) Filed: Aug. 20, 2018

(65) Prior Publication Data

US 2019/0068323 A1 Feb. 28, 2019

Related U.S. Application Data

(60) Provisional application No. 62/549,283, filed on Aug. 23, 2017.

(51) Int. Cl.
*H04L 1/00* (2006.01)
*H03M 7/40* (2006.01)
(Continued)

(52) U.S. Cl.
CPC ............ *H04L 1/0058* (2013.01); *H03M 7/40* (2013.01); *H04B 10/66* (2013.01); *H04L 1/0041* (2013.01);
(Continued)

(58) Field of Classification Search
CPC ... H04L 1/0058; H04L 1/0057; H04L 1/0625; H04B 10/66; H03M 7/40
(Continued)

(56) References Cited

U.S. PATENT DOCUMENTS 6,173,208 B1 * 1/2001 Park ................... G05B 19/056
700/18
6,718,491 B1 * 4/2004 Walker ................... H04L 7/041
714/701
(Continued)

OTHER PUBLICATIONS

"Interfaces for the optical transport network", ITU-T G.709/Y.1331, International Telecommunication Union, Jun. 2016, pp. 1-253.

*Primary Examiner* — Juan A Torres
(74) *Attorney, Agent, or Firm* — Glass and Associates; Kenneth Glass

(57) ABSTRACT

A system and method for block-code transcoding. An input signal is analyzed to determine if the input signal includes multiple control words, multiple data words and a single control word or only data words. If the input signal comprises multiple control words, the method includes, generating a control word location map and mapping the control codes and any data words to a block-code encoded transmission signal. If the input signal comprises a single control word and multiple data words, the method includes, generating a control word location address indicating a location of the single control word and mapping the control code and the multiple data words to a block-code encoded transmission signal. If the input signal comprises only data words, the method includes, mapping the data words sequentially into the block-code encoded transmission signal. Accordingly, the bandwidth efficiency of the transmission signal is improved by varying the encoding technique used dependent upon the contents of the input signal.

20 Claims, 10 Drawing Sheets

(51) Int. Cl.
*H04L 1/06* (2006.01)
*H04B 10/66* (2013.01)

(52) U.S. Cl.
CPC .......... *H04L 1/0045* (2013.01); *H04L 1/0625* (2013.01); *H04L 1/0057* (2013.01)

(58) Field of Classification Search
USPC ........................................................ 375/253
See application file for complete search history.

(56) References Cited

U.S. PATENT DOCUMENTS

| | | | |
|---|---|---|---|
| 6,952,405 B2 | 10/2005 | Tsang et al. | |
| 7,127,653 B1 | 10/2006 | Gorshe et al. | |
| 7,508,800 B1 * | 3/2009 | Deng | H04L 1/0061 370/338 |
| 8,199,772 B2 * | 6/2012 | Surek | H04J 3/1658 370/467 |
| 8,898,550 B2 * | 11/2014 | Cideciyan | H03M 13/13 714/752 |
| 9,054,894 B2 * | 6/2015 | Kobayashi | H04J 3/1658 |
| 9,166,618 B2 * | 10/2015 | Cideciyan | H03M 5/145 |
| 9,451,057 B1 * | 9/2016 | McClellan | H04L 1/0041 |
| 2002/0156913 A1 | 10/2002 | Tsang et al. | |
| 2002/0159484 A1 | 10/2002 | Azizoglu et al. | |

\* cited by examiner

| Control Block Indicator (200) | Byte 1 (205) | | Byte 2 | Byte 3 | Byte 4 | Byte 5 | Byte 6 | Byte 7 | Byte 8 |
|---|---|---|---|---|---|---|---|---|---|
| | bit 1 (210) | bits 2-8 (235) | | | | | | | |
| 0 | D1 (215) | (220) | D2 | D3 | D4 | D5 | D6 | D7 | D8 |
| 1 | 0 | Location Address \| Code | D1 | D2 | D3 | D4 | D5 | D6 | D7 |
| 1 | 1 | Control Word Location Map (230) | D/C | D/C | D/C | D/C | D/C | D/C | D/C |

FIG. 2

| Input Signal | C1 | C2 | D1 | D2 | D3 | D4 | D5 | D6 |
|---|---|---|---|---|---|---|---|---|
| Block-Code Encoded Transmission Signal | 1100000 | c1, c2 | D1 | D2 | D3 | D4 | D5 | D6 |

FIG. 3A

| Input Signal | C1 | C2 | D1 | D2 | D3 | D4 | D5 | C3 |
|---|---|---|---|---|---|---|---|---|
| Block-Code Encoded Transmission Signal | 1100000 | c1, p | c2, c3 | D1 | D2 | D3 | D4 | D5 |

FIG. 3B

| Input Signal | D1 | D2 | D3 | D4 | C1 | C2 | C3 | D5 |
|---|---|---|---|---|---|---|---|---|
| Block-Code Encoded Transmission Signal | 0000111 | D1 | D2 | D3 | D4 | c1, p | c2, c3 | D5 |

FIG. 3C

| Input Signal | D1 | D2 | D3 | D4 | C1 | C2 | C3 | C4 |
|---|---|---|---|---|---|---|---|---|
| Block-Code Encoded Transmission Signal | 0000111 | D1 | D2 | D3 | D4 | c1, p | c2, p | c3, c4 |

FIG. 3D

| Input Signal | C1 | D1 | C2 | D2 | C3 | D3 | C4 | D4 |
|---|---|---|---|---|---|---|---|---|
| Block-Code Encoded Transmission Signal | 1010101 | c1, p | c2, p | c3, c4 | D1 | D2 | D3 | D4 |

FIG. 3E

| Control Block Indicator | Word 1, Byte 1 | | Word 1, Bytes 2-8 | Word i, Byte 1 | Word i, Bytes 2-8 | Word 8, Byte 1 | Word 8, Bytes 2-8 |
|---|---|---|---|---|---|---|---|
| | bit 1 | bits 2-4  bits 5-8 | | | | | |
| 0 | | D1 | | Di | | D8 | |
| 1 | 0 | Location Address  Code | 56 bits of CB | Di | | D7 | |
| 1 | 1 | Control Word Location Map | 56 bits of CB | D/C | | D/C | |

FIG. 4

Input Signal: | C1 | D1 | C2 | D2 | C3 | D3 | D4 | D5 |

| Control Block Indicator | Word 1, Byte 1 b1  b2-b8 | Word 1, Bytes 2-8 | Word 2, Byte 1 | Word 2, Bytes 2-8 | Word 3 | Word 4, Byte 1 | Word 4, Bytes 2-8 | Word 5 | ... | Word 8 |
|---|---|---|---|---|---|---|---|---|---|---|
| 1 | 1  10101 | 56bits of Control Block #1 | cc 1 | P | 56bits of Control Block #2 | 64bits of D1 Data | cc 2 | cc 3 | 56bits of Control Block #3 | 64bits of D2 Data | ... | 64bits of D5 Data |

FIG. 5

SYSTEM AND METHOD FOR BLOCK-CODING TRANSCODING

BACKGROUND OF THE INVENTION

Bandwidth efficient transparent block-code transcoding techniques are known in the art for the transmission of data streams over a communication channel. Popular block-codes used for transmitting signals over an Optical Transport Network (OTN), such as 8 B/10 B and 64 B/66 B commonly used for Ethernet signals, are not bandwidth efficient enough to allow encoded client signals to be carried transparently over a transport network utilizing the ITU-T G.709 transport protocol. While more bandwidth efficient block-codes have been developed that allow a transparent transcoding between the encoded client signal and the more bandwidth efficient codes, the block-codes currently known in the art suffer from several deficiencies.

Block-codes in accordance with the Generic Framing Procedure (GFP) outlined in ITU-T G.7041 transcode a group of eight 8 B/10 B codes into a 64 B/65 B code and ITU-T G.709 extends the G.7041 coding method to transcode eight 64 B/66 B codes into a 512 B/513 B code. However, one disadvantage to using G.7041 and G.709 defined codes is the use of address chaining to identify the locations of the control information within the original data stream, which may result in increased errors at the decoder, since an errored bit in any address in the chain will result in the corruption of multiple bytes after decoding. Additionally, G.709 and G.7041 coding requires that all of the control information be positioned at the beginning of the block, thereby increases the transmission latency at the receiver, which is undesirable.

Accordingly, what is needed in the art is an improved system and method for block-code transcoding that provides reduced latency and is more robust than the block-code encoding methods currently known in the art, thereby providing for more reliable signal transmission and lower error rates.

SUMMARY OF THE INVENTION

A system for block-code transcoding is disclosed that includes a block-code encoder configured for: receiving an input signal and determining if the input signal includes multiple control words, a single control word or only data words. If the decoded input signal includes multiple control words, the block-code encoder is further configured for: generating a control word location map; encoding each of the multiple control words to generate multiple control codes; mapping the control word location map, each of the multiple control codes and each data word in the input signal into the block-code encoded transmission signal to indicate a location of each of the multiple control words in the input signal. If the decoded input signal includes a single control word, the block-code encoder is further configured for: generating a control word location address indicating a location of the single control word in the decoded input signal; encoding the single control word to a control code; and mapping the control word location address, the control code and each of the data words in the input signal into the block-code encoded transmission signal. If the decoded input signal includes only data words, the block-code encoder is further configured for: mapping each of the data words in the input signal sequentially into the block-code encoded transmission signal.

A method for block-code transcoding is disclosed that includes receiving a block-code encoded input signal at a decoder, the block-code encoded input signal encoded using a first block-code, and decoding the block-code encoded input signal to generate a decoded input signal. The decoded input signal is received at a block-code encoder, the decoded input signal to be mapped into a block-code encoded transmission signal encoded using a second block-code, wherein the second block-code is more bandwidth efficient than the first block-code.

If the decoded input signal is determined to include multiple control words, the method further includes: generating a control word location map; encoding each of the multiple control words to generate multiple control codes; mapping the control word location map, each of the multiple control codes and each data word in the decoded input signal into the block-code encoded transmission signal to indicate a location of each of the multiple control words in the decoded input signal.

If the decoded input signal is determined to include a single control word, the method further includes: generating a control word location address indicating a location of the single control word in the decoded input signal; encoding the single control word to a control code; mapping the control word location address, the control code and each of the data words in the decoded input signal into the block-code encoded transmission signal.

If the decoded input signal is determined to include only data words, the method further includes mapping each of the data words in the decoded input signal sequentially into the block-code encoded transmission signal.

The coding overhead for an 8 B/10 B coding scheme is 25%, wherein the encoder adds 2 bits of extra information, or overhead, for every 8 bits of user information. As the bit rate of the high-speed transmission channel increases, this overhead grows in terms of overall bandwidth. As such, for a serial transmission channel that is capable of transmitting data at a rate of 10 Gpbs (Gigibits per second) and is encoded utilizing an 8 B/10 B coding scheme, only 8 Gpbs would be available for actual user data and the remaining 2 Gbps would be needed for the coding overhead. Lower overhead encoding schemes are known in the art, such as 64 B/65 B and 512 B/513 B encoding schemes. The 64 B/66 B coding scheme was developed for transporting a 10 Gpbs Ethernet data stream over a single high-speed transmission channel. The 64 B/65 B encoding includes 8 bytes (i.e. 64 b bits) of data bytes, control bytes or a combination thereof and only 1 overhead bit. As such, 64 B/65 B encoding is more bandwidth efficient than the 8 B/10 B coding scheme because the total overhead (1 bit for every 64 bits) for 64 B/65 B is only about 1.5% as compared to the 25% overhead for 8 B/10 B encoding. Additionally, 512 B/513 B encoding includes 64 bytes (i.e. 512 bits) of data bytes, control bytes or a combination thereof, and 1 overhead bit. As such, the overhead for 512 B/513 B encoding is significantly more efficient than 64 B/66 B encoding. In exemplary embodiments of the present invention, an 8 B/10 B block-code input signal may be transcoded to a 64 B/65 B block-code transmission signal and a 64 B/66 B block-code input signal may be transcoded to a 512 B/513 B block-code transmission signal, thereby providing for a more bandwidth efficient block-code encoded transmission signal.

The present invention allows for both 64 B/65 B and 512 B/513 B encoding in order to meet standard OTN bandwidth efficiency requirements. In addition, an explicit map of the control word locations in the client input signal is utilized instead of a chain of address locations for improved robustness. The control information encoding of the present invention does not require so many bits such that a block must contain fewer input signal data characters. As such, each of the encoded blocks of the present invention encode the same number of data characters. In addition, all encoded information in the resulting block-code transmission signal remains byte-aligned to allow for simplified data path processing.

In embodiments of the present invention control codes are placed in the block-code encoded transmission signal at locations corresponding to where the control words occurred in the input signal, the receiving decoder only requires a single byte of latency in order to determine the content of the first word of the input signal, which is encoded into the next byte of the received block. This results in reduced latency as compared to prior art systems that utilize chain address locations.

Accordingly, in various embodiments, the present invention provides an improved system and method for block-code transcoding that provides reduced latency and is more robust than the block-code encoding methods currently known in the art.

BRIEF DESCRIPTION OF THE DRAWINGS

The accompanying drawings, which are incorporated in and form a part of this specification, illustrate various embodiments and, together with the Description of Embodiments, serve to explain principles discussed below. The drawings referred to in this brief description should not be understood as being drawn to scale unless specifically noted.

FIG. 2 is a table illustrating an exemplary embodiment for 64 B/65 B block-code, in accordance with an embodiment of the present invention.

FIG. 3A is a table illustrating a first exemplary embodiment of 64 B/65 B encoding of an input signal wherein the control codes are distributed throughout the block, in accordance with an embodiment of the present invention.

FIG. 3B is a table illustrating a second exemplary embodiment of 64 B/65 B encoding wherein the control codes are distributed throughout the block, in accordance with an embodiment of the present invention.

FIG. 3C is a table illustrating a third exemplary embodiment of 64 B/65 B encoding wherein the control codes are distributed throughout the block, in accordance with an embodiment of the present invention.

FIG. 3D is a table illustrating a fourth exemplary embodiment of 64 B/65 B encoding wherein the control codes are distributed throughout the block, in accordance with an embodiment of the present invention.

FIG. 3E is a table illustrating a fifth exemplary embodiment of 64 B/65 B encoding wherein the control codes are placed at the beginning of the block, in accordance with an embodiment of the present invention.

FIG. 4 is a table illustrating an exemplary embodiment of 512 B/513 B transcoding of an input signal, in accordance with an embodiment of the present invention.

FIG. 5 a table illustrating a first exemplary embodiment of 512 B/513 B encoding, in accordance with an embodiment of the present invention.

DETAILED DESCRIPTION OF THE INVENTION

Figure 1:
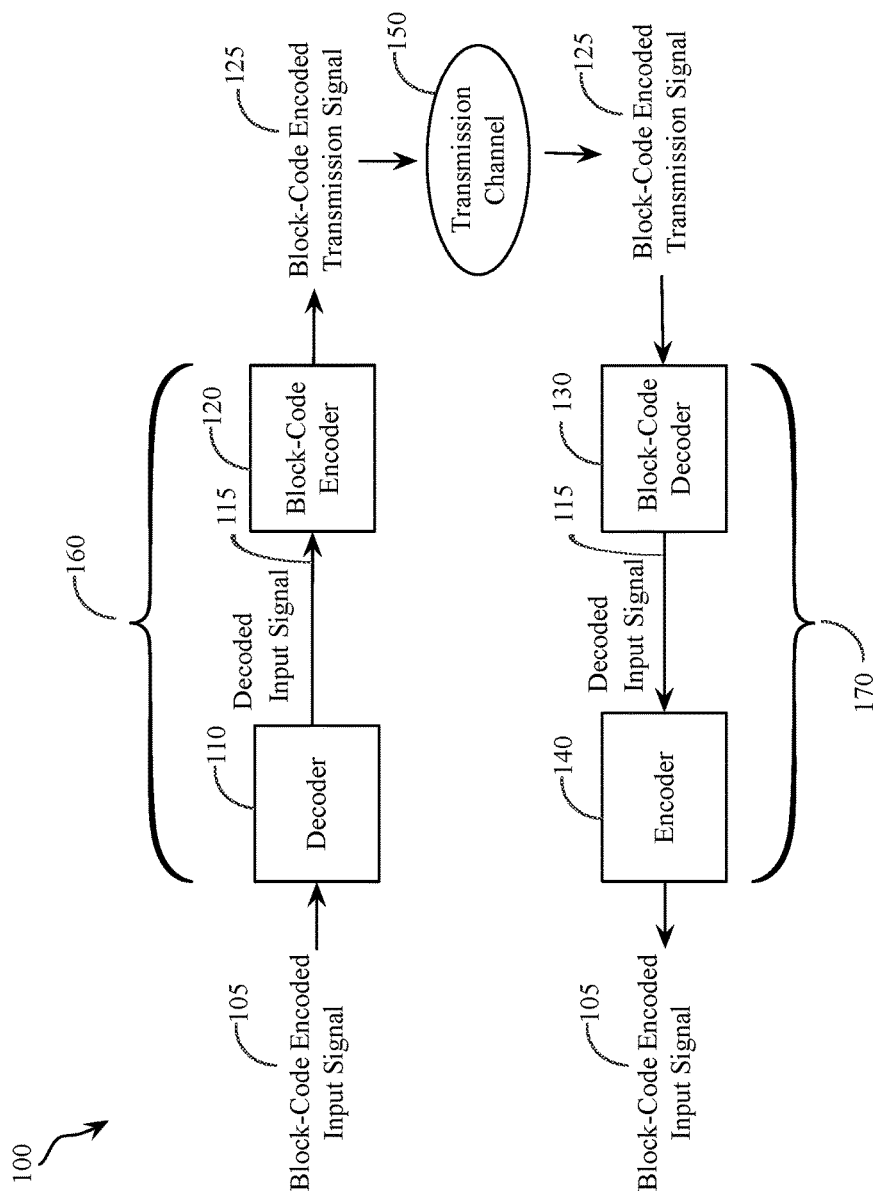
FIG. 1 is a block diagram of a system incorporating block-code transcoding, in accordance with an embodiment of the present invention.

Reference will now be made in detail to various embodiments, examples of which are illustrated in the accompanying drawings. While various embodiments are discussed herein, it will be understood that they are not intended to be limiting. On the contrary, the presented embodiments are intended to cover alternatives, modifications, and equivalents, which may be included within the spirit and scope of the various embodiments as defined by the appended claims. Furthermore, in this Detailed Description of the Invention, numerous specific details are set forth in order to provide a thorough understanding. However, embodiments may be practiced without one or more of these specific details. In other instances, well known methods, procedures, components, and circuits have not been described in detail as not to unnecessarily obscure aspects of the described embodiments.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In accordance with various embodiments of the present invention, an efficient system for transmitting information signals over an optical communication network is provided. More specifically, the invention provides a system and method for transparent block-code transcoding that is more bandwidth efficient than other block-code transcoding systems and methods currently known in the art. The block-code transcoding of the present invention does not require chain addressing, thereby reducing subsequent decoding errors and is also scalable to provide for encoding of larger block sizes. By utilizing the block-code encoding system and method of the present invention, the data carrying capacity required to transmit gigabit Ethernet (GbE) signals over a communication channel is minimized, thereby enabling efficient and transparent transmission of the information signals over a communication network.

Block-code encoding, as used herein, is a type of encoding wherein a number of bits are added to a bit group in order to achieve a desired effect. In block-code encoding, an input signal comprising data words and possibly including one or more control words is received at an encoder and the data words and the one or more control words are mapped or encoded into a block-code encoded transmission signal utilizing a specific block-code encoding technique. It is appreciated that, the term "control word" and "data word" are used throughout the description of the invention to refer to unencoded characters or symbols. Additionally, "control code" and "data code" are used throughout the description to refer to encoded transmission characters or symbols. In general, a kB/nB line codes takes "k"-bit input signal comprising data words and control words and expands it to an "n"-bit symbol comprising data codes and control codes for transmission over a communication channel, wherein the additional "n-k" bits are used for functions such as distinguishing between data and control information and for simplifying a receiver clock recovery. The number of bits added to the bit group is commonly referred to as the overhead for the block code. Maximum block code efficiency is achieved when the ratio of the overhead required for the block code to the total block size is minimized. This ratio is minimized by increasing the number of client payload words per block and/or by minimizing the number of overhead bits required. Ideally, an efficient block code should have a single bit to indicate whether the block contains data words or a combination of data words and control words. As such, assuming a one byte data word size, when transcoding from one block code to a new block code that is more efficient, in order to achieve maximum encoding efficiency, the new block code must be able to store the control code identifying the type of control word and the location of the control word in the input signal in a format that requires no more than one overhead byte per control word.

In a specific example, 8 B/10 B encoding is used to map 8-bit data words into 10-bit code words for transmission over a communication channel. Control codes are typically generated by reading a control code from a look-up table (LUT) as indexed by the control word in the input signal. The control codes require fewer bits than the control words and it is ideal to have the control codes use as few bits as possible to uniquely map each of the control words. For example, in the case of twelve control words, a minimum of four bits are required to uniquely map each of these to control codes and in the case of eight control words, a minimum of three bits are required. These are exemplary embodiments and it is understood that numerous other block-code encoding schemes are possible, including 64 B/65 B and 512 B/513 B block-code encoding schemes.

In the present invention, transparent communication of the control codes and efficient bandwidth transmission is achieved by transcoding the input signal into a more efficient block-code encoded transmission signal. In the exemplary case of transcoding an 8 B/10 B signal to a 64 B/65 B signal, the first step is to decode the 8 B/10 B signal into the original 8-bit data words and associated control words. These data words and control words are then re-encoded, or mapped, into a 64 B/65 B code. Each 64 B/65 B code carries the information of eight of the 8 B/10 B words. For the data codes, the original 8-bit data words are mapped directly into the payload bytes of the 64 B/65 B codes and the 8 B/10 B control words are re-encoded and mapped into one or more bytes in the 64 B/65 B encoded signal. Accordingly, in various embodiments, the transcoding methods are provided by the present invention for encoding the transmitted signals so that they can be efficiently and transparently transmitted within the available bandwidth of the communication channel without losing any control information of the input signal.

FIG. 1 illustrates an embodiment of the system 100 of the present invention including a transmitter 160, a receiver 170 and a transmission channel 150 positioned between the transmitter 160 and the receiver 170. The transmitter 160 and the receiver 170 may include both hardware and software components. At the transmitter 160, a decoder 110 receives a block-code encoded input signal 105, and decodes the block-code encoded input signal 105 to provide a decoded input signal 115 to a block-code encoder 120 implementing the present invention to generate a more bandwidth efficient block-code encoded transmission signal 125. At the receiver 170, a block-code decoder 130 receives and decodes the block-code encoded transmission signal 120 to recover the decoded input signal 115 and then transmits the decoded input signal 115 to an encoder 140 which regenerates the block-code encoded input signal 105.

In one embodiment, the block-code encoded input signal 105 may be an 8 B/10 B stream of encoded characters or symbols. The decoder 110 is configured for decoding the encoded input signal 105 to generate a decoded input signal 115 comprising data words and control words. The decoded input signal 115 is then provided to a block-code encoder 120 of the present invention that is configured for receiving the input signal 115 and for mapping the decoded input signal 115 into a block-code encoded transmission signal 125, wherein the block-code encoded transmission signal 125 is more bandwidth efficient than the block-code encoded input signal 105. For example, an 8 B/10 B encoded input signal 105 may be received at the decoder 110 and decoded to provide a decoded input signal 115 to the block-code encoder 120. The decoded input signal 115 may be an 8-byte input signal comprising 8 bytes of data words or the decoded input signal 115 may be an 8-byte input signal comprising data words and one or more control words. To provide a more bandwidth efficient signal, the block-code encoder 120 may be configured for mapping the 8 bytes of the decoded input signal 115 into a 64 B/65 B block-code encoded transmission signal 125 for transmission over a communication channel.

In order to map the decoded input signal 115 to generate a more bandwidth efficient block-code encoded transmission signal 125, the block-code encoder 120 initially determines if the bits of the decoded input signal 115 to be encoded into a block of the block-code encoded transmission signal 125 includes multiple control words, a single control word or only data words.

If the block-code encoder 120 determines that the bits of the decoded input signal 115 to be encoded into a block of the block-code encoded transmission signal comprises multiple control words, the block-code encoder 120 sets a control block indicator flag for the block of bytes to a first logic value (for example, the control block indicator flag may be set to "1"), to indicate that the block of bytes of the input signal 115 includes at least one control word and sets a multiple control word indicator in the first bit of the first byte the block of bytes to the first logic level, to indicate that the decoded input signal 115 includes multiple control words. In a particular embodiment, setting the multiple control word indicator to a "0" indicates that there is only a single control word in the input signal 115 and setting the multiple control word indicator to a "1" indicates that the decoded input signal 115 includes more than one control word.

After appropriately setting the control block indicator flag and the multiple control word indicator for each byte of the block-code encoded transmission signal to the appropriate logic values to indicate that the decoded input signal 115 to be block-encoded includes multiple control words, the encoder 120 then generates a control word location map indicating a location of each of the multiple control words in the decoded input signal 115 and encodes each of the multiple control words of the decoded input signal 115 to generate multiple control codes. In the case of an input signal containing multiple control words, the multiple control word indicator requires 1 bit, leaving only 7 bits in the overhead byte to encode the control word location map, which may require up to 8 control word locations. As such, in the present invention, the control word location map explicitly encodes 7 of the control word locations and the $8^{th}$ location implicitly encodes using a combination of the control word location map and the positioning of the control codes in the block-code encoded transmission signal. The encoder then stores the control word location map into the remaining seven bits of the first byte of the block of bytes, thereby providing an explicit location map for the control information in bytes 2-7 of the original input signal and implicitly encoding the input signal word of byte 8. Specifically, a "1" in bit k of the control word location map indicates the presence of a control word in byte k of the first 7 bytes of the block of bytes of the input signal. As explained in detail below, the indication of whether the $8^{th}$ byte of the block of bytes of the input signal contains a data word or a control word is communicated implicitly as part of the mapping algorithm.

As such, in accordance with the present invention, when the block-code encoder 120 determines that there are multiple control words in a block of bytes to be transcoded into a block-code encoded transmission signal 125, the block-code encoder 120 sets a control block indicator flag bit for the block of the block-code encoded transmission signal 125 to a first logic level, sets a multiple control word indicator for the block of the block-code encoded transmission signal 125 to the first logic level and maps the multiple control word indicator and the control word location map to a first byte of the block of bytes of the block-code encoded transmission signal 125.

In order to map each of the multiple control codes and the multiple data words into the block-code encoded transmission signal 125, beginning with a second byte of the block of bytes, the block-code encoder 120 maps data words in the decoded input signal 115 into a block of the block-coded transmission signal 125 according to the order of the data words in the decoded input signal 115 until a control word is reached in the decoded input signal 115. When a control word is reached, the block-code encoder 120 maps the control code associated with the control word of the decoded input signal 115 to a first plurality of bits at the control word location. The encoder 120 then maps the control code associated with a next control word in the decoded input signal 115 to a second plurality of bits at the control word location if the next control word is the last control word in the decoded input signal 115 or the block-code encoder 120 maps padding bits to the second plurality of bits at the control word location if the next control word is not the last control word in the input signal 115. Accordingly, the present invention places a pair of control codes in the next to last control word location in the block-code encoded transmission signal 125 and all other control word locations contain a single control code plus padding bits. As such, the last control word location contains a data byte, so that all the information is contained within the 7-byte block payload field. The implied content of the last input word of the input signal 115 is indicated through the control word location in the control word location map that contains two control codes rather than a single control code plus padding bits. More specifically, if the last control word location of the control word location map contains two control codes, then it is implied that the last word of the input signal 115 was a control word and the second of the two control codes is associated with this control word. Alternatively, if the next-to-last control word location of the control word location map contains two control codes, then the second control code of the two control codes is associated with the last control word location indicated by the control word location map and it is implied that the last word of the decoded input signal 115 is a data byte.

As such, the present invention achieves implicit encoding of the $8^{th}$ word location in the block code encoded transmission signal 125 by using bits 2-8 of the overhead byte to explicitly encode the location of the control words in the first 7 bytes of the block and the control word locations are used to carry control code information so that no additional overhead bits are required. In the case of an 8-byte block, since there are only 7 payload bytes following the overhead byte, one of the control code locations must contain two of the 4-bit control codes in order to reduce the payload size by enough bits to accommodate the 8-bit overhead byte.

In the embodiment previously described, the block-code encoder 120 maps data words and each of the multiple control codes into the block-code encoded transmission signal 125 at locations corresponding to the location of each of the data words and each of the multiple control words in the input signal 115. This distributed approach for placing control information into a block of the block-code encoded transmission signal 125 at control word locations that correspond to the control words in the decoded input signal 115 is not possible with the prior art solutions, which require that all the control information be positioned at the beginning of the block of the block-code encoded transmission signal 125.

In addition, in the case of multiple control words, the invention also allows for an alternative byte ordering that places all of the bytes containing control words at the beginning of the block, followed by data words. In this alternative embodiment, the block code encoder 120 maps each of the multiple control codes into a beginning of a block of the block-code encoded transmission signal 125 and then maps data words into the block following the multiple control codes, according to the order of the multiple data words in the input signal.

Regardless of whether or not the control words are placed at the beginning of the block of the block-code encoded transmission signal 125 or distributed according to the locations of the control words in the decoded input signal 115, the control word location map allows the receiver 170 to properly restore the byte order in either case, provided that the block-code encoder 120 and the block-code decoder 130 use consistent conventions. However, grouping the control information at the beginning of the block increases the required latency at the block-code decoder 130 of the receiver 170. For example, if the decoded input signal 115 contains a data word followed by seven control words, the decoder 130 would not encounter the data word until after the control information bytes have been received. Hence grouping the control words at the beginning of the block of the block-encoded transmission signal 125 creates an inherent seven-byte minimum latency in the case of 64 B/65 B block-code encoding. Alternatively, if the control codes are placed in the block-code encoded transmission signal 125 at locations corresponding to where the control words occurred in the input signal 115, the receiving decoder 130 only requires a single byte of latency in order to examine the first byte of the block of the block-code encoded transmission signal 125 to find the control word location information.

If the block-code encoder 120 determines that the bits of the decoded input signal 115 to be encoded into a block of the block-code encoded transmission signal 125 include only a single control word instead of multiple control words, the block-code encoder 120 generates a control word location address indicating a location of the single control word in the input signal, encodes the single control word to a control code and maps the control word location address, the control code and the data words in the decoded input signal 115 into the block-code encoded transmission signal 125 for transmission over the transmission channel 150.

The presence of a single control word in the decoded input signal 115 is a special case because compressing the control word to a 4-bit control code does not save enough bandwidth to accommodate the inclusion of a control word location address in the block. As such, when the block-code encoder 120 determines that the block of bytes of the decoded input signal 115 comprises multiple data words and only a single control word, the block-code encoder 120 sets a control block indicator flag for the block of bytes to a first logic value (for example, the control block indicator flag may be set to "1"), to indicate that the block of bytes of the decoded input signal 115 includes at least one control word and sets a multiple control word indicator in the first bit of the first byte the block of bytes to a second logic level (for example, the multiple control block indicator may be set to "0"), to indicate that the decoded input signal 115 includes only a single control word. In a particular embodiment, setting the multiple control word indicator to a "0" indicates that there is only a single control word in the decoded input signal 115 and setting the multiple control word indicator to a "1" indicates that the decoded input signal 115 includes more than one control word. In the specific case for 64 B/65 B encoding, the control word location address is then mapped to the following three bits of the first byte of the block of bytes and the last four bits of the first byte contain the associated single control code.

After appropriately setting the control block indicator flag and the multiple control word indicator for each byte of the block-code encoded transmission signal 125 to the appropriate logic values to indicate that the input signal to be block-encoded includes only a single control word, the encoder 120 then generates a control word location address and encodes the single control words of the decoded input signal 115 to generate a control code. The encoder 120 then maps the control word location address to a first plurality of bits following the first bit of the first byte of the block of bytes of the block-code encoded transmission signal 125 and maps the control code for the single control word to a second plurality of bits following the first plurality of bits of the first byte of the block of the block-code encoded transmission signal 125 to indicate the location of the single control word in the decoded input signal 115.

As such, in accordance with the present invention, when the block-code encoder 120 determines that there are multiple data words and only one control word in the bits to be transcoded into a block of block-code encoded transmission signal 125, the block-code encoder 120 sets a control block indicator flag for the block of the block-code encoded transmission signal 125 to a first logic level, sets a multiple control word indicator for the block of the block-code encoded transmission signal 125 to a second logic level, and maps the multiple control word indicator, the control word location address and the single control code to a first byte of the block of bytes of the block-code encoded transmission signal 125. The encoder 120 then maps each of the multiple data words into the block-code encoded transmission signal 125, beginning with a second byte of the block of bytes, the block-code encoder 120 maps the multiple data words into a block of the block-coded transmission signal 125 according to the order of the multiple data words in the input signal 115.

If the block-code encoder 120 determines that the bits of the decoded input signal 115 to be encoded into a block of the block-code encoded transmission signal 125 include only data words (no control words), the block-code encoder 120 sets a control block indicator flag for the block of bytes to a second logic value (for example, the control block indicator flag may be set to "0"), to indicate that the block of bytes of the decoded input signal 115 includes only data words and maps the data words in the decoded input signal 115 sequentially into the block-code encoded transmission signal 125 for transmission over the transmission channel.

FIG. 2 illustrates a table showing the bit settings for an exemplary embodiment of the invention for implementing a transcoding of an 8 B/10 B block-coded encoded input signal 105 to a 64 B/65 B block-code encoded transmission signal 125. As shown in FIG. 2, row 1 of the table illustrates the bit settings wherein all eight bytes of the block of the input signal to be transcoded are data words. Row 2 illustrates bit settings for an eight-byte input signal comprising a single control word and row 3 illustrates the bit settings for an eight-byte input signal comprising multiple control words.

As shown in this exemplary embodiment, the encoder 120 sets the control block indicator flag 200 to a "0" when the decoded input signal 115 to be transcoded consists of only data words and sets the control block indicator flag 200 to a "1" when one or more control words are present in the decoded input signal 115. The first byte 205 of the block-code encoded transmission signal 125 is structured such that the first bit 210 of the first byte 205 indicates whether the block contains a single control code or multiple control codes. If only data words are to be encoded, preferably all of the bytes 1-8 contain the data words in the order in which they appeared in the decoded input signal 115 (D1-D8). Otherwise, if the input signal includes one or more control words, the first byte is structured such that, a "0" in the first bit 210 of the first byte 205 indicates that there is only a single control code in the block of bytes to be transcoded and a "1" in the first bit 210 of the first byte 205 indicates that there are multiple control codes in the block of bytes to be transcoded. If the decoded input signal 115 includes only a single control word, then a 3-bit location address 215 pointing to the original location of the single control word within the block of bytes of the decoded input signal 115 is mapped to bits 2-4 of the first byte 205 and a 4-bit single control code 220 is mapped to bits 5-8 235 of the first byte. The data words are then mapped into bytes 2-8, preferably as they appeared in the input signal (D1-D7). Alternatively, if the decoded input signal 115 includes multiple control words, then the control word location map 230 is mapped to bits 2-8 of the first byte 205 and the control words and the data words are then mapped into bytes 2-8, preferably in the order they appeared in the decoded input signal 115, wherein bytes 2-8 contain data words if the decoded input stream 115 had data in a particular location or control codes as defined in the control word location map. It is appreciated that there may not be any data words in a particular decoded input stream 115 (that is, the decoded input stream includes only control words). In that event, the control codes are mapped into bytes 2-8, in the order they appeared in the decoded input stream 115 with bytes 2-7 including a control code and pad bits and byte 8 including the last two control codes.

Examples of the block-code encoding provided by the encoder 120 of the present invention are illustrated with reference to FIG. 3A-FIG. 3E. In FIG. 3A-FIG. 3E, multiple control codes are present in the 8 B/10 B block-coded encoded input signal that is to be encoded into a 64 B/65 B block-code encoded transmission signal, and the control block indicator flag 200 and the multiple control word indicator 210 is not shown. In FIG. 3A-FIG. 3E, the first byte only shows the control word location map 230, i.e. bit 1 containing multiple control word indicator is not shown. In these embodiments, "cn" represents a number "n" of 4-bit control codes and "p" represents a 4-bit pad.

In FIG. 3A and FIG. 3B, the input signal to be transcoded comprises a first control word at byte 1 (C1) and a second control word at byte 2 (C2) of bytes 1-7 of the input signal. As such, in the transcoding process performed by the block-code encoder 120, the control word location map that is mapped to bits 2-8 of the first byte of the block-coded transmission signal 125 includes a "1" in bits 2 and 3 and a "0" in bits 4-8. As such, the 7 bits (2-8) of the first byte form a map of the control code locations within the first 7 bytes of the decoded input signal 115, where a "1" in bit "j" of the 7-bit field indicates that control information was present in input signal byte "j".

After the control word location map 230 has been mapped into the first byte of the block-code encoded transmission signal, the encoder them continues by mapping the bytes of the input signal into the block-code encoded transmission signal 125, beginning with the second byte of the block-code encoded transmission signal 125, preferably in the order in which they appear in the input signal. The encoder continues mapping until the first control word (C1) is reached. When the first control word (C1) is reached, the encoder maps the first 4-bits of the respective byte of the block-code encoded transmission signal 125 to contain the 4-bit control code (c1) associated with the first control word (C1) and maps the second 4 bits of the respective byte of the block-code encoded transmission signal to contain the 4-bit control code (c2) of the next control word (C2) if the next control word is the last control word to be mapped to the block, as in the case in the decoded input signal 115 of FIG. 3A, where the second byte of the block-code encoded transmission signal 125 is encoded with the control words found in the first two bytes of decoded input signal 115. If, if the next control word (C2) is not the last control word input to the block, as is the case in FIG. 3B where there is a third control word (C3) following the second control word (C2), the second 4-bit field of the respective byte is set to contain a 4-bit pad to indicate that more than one control word remains to be mapped. Next, if the control word location map indicates a data byte(s) following the first of the now encoded control words (not shown), the encoder 120 maps the data bytes(s) into the block-code encoded transmission signal 125 in order until the next control word location is reached. When the next control word location is reached, if the previous control word location in the block-code transmission signal 125 contained two control codes, then the byte at this location is filled with the next data byte. As such, in FIG. 3A, the second byte of the block-code encoded transmission signal includes two control codes (c1, c2) because the second control word in the input signal is the last control word to be mapped to the block. The explicit 7-bit control word location map (1100000) explicitly indicates the location of control words at byte 1 (C1) and byte 2 (C2) of the input signal. As such, by placing two control codes (c1, c2) in the next to last explicitly identified control code location of the block-code encoded transmission signal 125, implies that the second control code (c2) is associated with this last control word (C2) of the input signal and the last input word of the input signal is a data byte.

If the previous control word location in the block-code transmission signal 125 included a 4-bit pad (p), and only one more control word in the input signal occurs after this location, then the 4-bit control code (c2) corresponding to this location is mapped into the first 4-bits and the 4-bit control code (c3) corresponding to the last control word location in the input signal is mapped into the last 4-bits. Additionally, if the previous control code location included a 4-bit pad, and more than one control word in the decoded input signal occurs after this location, then the 4-bit control code associated with this location is mapped into the first 4 bits and the remaining 4 bits are mapped with a 4-bit pad. As such, in FIG. 3B, the second byte of the block-code encoded transmission signal 125 includes one control codes (c1) and a 4-bit pad (p) because the second control word in the input signal is not the last control word to be mapped to the block and the third byte includes two control codes (c2, c3) because the third control word in the input signal is the last control word to be mapped to the block. The explicit 7-bit control word location map (1100000) explicitly indicates the location of control words at byte 1 and byte 2 of the input signal. However, there is also another control word (C3) at byte 8 of the input signal that needs to be implicitly identified. By placing two control codes (c2, c3) in the last explicitly identified control word location of the block-code encoded transmission signal, implies that the last input word (byte 8) of the decoded input signal is a control word and the second control code (c3) is associated with the last control word location (C3), i.e. with the last input word (byte 8).

The above steps are repeated until the end of the block of bytes of the input signal is reached.

In an additional embodiment shown in FIG. 3C, a control word location map is generated by the encoder to indicate the location of control words (C1, C2 and C3) in the input signal at byte locations 5, 6 and 7 and the control word location map is mapped into bits 2-8 of the first byte of the block-code encoded transmission signal. The encoder then begins sequentially mapping the data bytes to the block-code encoded transmission signal, beginning with the second byte. When the encoder encounters the first control word (C1) in the input signal, the encoder then determines whether or not the next control word (C2) is the last control word to be mapped. In the embodiment of FIG. 3C, the next control word (C2) is not the last control word to be mapped, because a third control word (C3) still remains to be mapped. As such, in accordance with the encoding algorithm, the encoder 120 maps the control code (c1) for the first control word (C1) into the first 4 bits of the respective byte of the block-code encoded control signal 125 and maps a 4-bit pad (p) into the second 4 bits of the byte. The encoder then continues mapping the bytes of the input signal into the block-code encoded transmission signal until the second control word (C2) is reached and when the second control word (C2) is reached, the encoder maps the control code (c2) for the second control word (C2) into the first 4 bits of the respective byte and maps the control code (c3) for the third control word (C3) into the second 4 bits of the byte, indicating that the third control word (C3) is the last control word remaining in the input signal to be mapped. The explicit 7-bit control word location map (0000111) explicitly indicates the location of control words at byte 5 (C1), byte 6 (C2) and byte 7 (C3) of the input signal. As such, by placing two control codes (c2, c3) in the next to last explicitly identified control word location (byte 6) of the block-code encoded transmission signal, implies that the second control code (c3) is associated with this last control word (C3) of the input signal and the last input word of the input signal is a data byte.

In the embodiment illustrated in FIG. 3D, the same control word location map is generated by the encoder to indicated control words (C1, C2, C3) at byte locations 5-7 of the input signal. While in this embodiment, a control word (C4) is located at byte location 8, the control word location map only identifies the contents of the bytes in the first 7 bytes of the input signal with the content of the last byte being implied by the encoding algorithm. Accordingly, in this embodiment, during the mapping of the bytes into the block-encoded transmission signal, when the encoder encounters the first control word (C1) at the $5^{th}$ byte of the input signal and the encoder determines that the second control word (C2) is not the last control word to be mapped, the encoder maps the control code (c1) of the first control word (C1) to the first 4 bits of the sixth byte of the block-code encoded transmission signal and maps a 4-bit pad (p) to the second 4 bits of the sixth byte of the block-code encoded transmission signal. The encoder 120 then continues mapping and when the second control word (C2) is reached and the encoder determines that the third control word (C3), i.e., the subsequent control word is not the last control word to be mapped, encoder 120 maps the control code (c2) of the second control word (C2) to the first 4 bits and a 4-bit pad (p) to the second 4 bits of the 7th byte of the block-code encoded transmission signal. The encoder 120 continues mapping and when the third control word (C3) is reached and the encoder determines that the fourth control word (C4) is the last control word to be mapped into the block-code encoded transmission signal from the input signal, the encoder 120 maps the control code (c3) of the third control word (C3) to the first 4 bits and the control code (c4) of the fourth (and final) control word (C4) to the second 4 bits of the 8th byte of the block-code encoded transmission signal. The explicit 7-bit control word location map (0000111) explicitly indicates the location of control words at byte 5 (C1), byte 6 (C2) and byte 7 (C3) of the input signal. However, there is also another control word (C4) at byte 8 of the input signal that needs to be implicitly identified. By placing two control codes (c3, c4) in the last explicitly identified control word location of the block-code encoded transmission signal (byte 7), implies that the last input word (byte 8) of the input signal is a control word and the second control code (c4) is associated with the last control word location (C4).

As illustrated in FIG. 3A-FIG. 3D, in accordance with the embodiments herein, if a control word location in the block-code encoded transmission signal 125 contains two control codes, the second control code always corresponds to the last control word of the input signal for that block. It follows that the contents of the last byte of the input signal are communicated implicitly by the encoding algorithm of the present invention wherein, if the last control word location indicated by the control word location map field contains two control codes, then the second control code mapped into that location corresponds to a control word in the last byte location of the decoded input signal 115 and if the next-to-last control word location indicated by the control word location map field contains two control codes, then the last byte of the input signal contained data. As such, in the cast of an 8 B/10 B encoded input signal, the indication of whether or not the $8^{th}$ byte of the input signal to be mapped to the block-code encoded transmission signal contains a data or control word is implicitly communicated as part of the mapping algorithm.

In the embodiments illustrated in FIG. 3A-FIG. 3D, the encoding performed by the encoder 120 distributes the control information within the block at the locations corresponding to the locations of the control words in the decoded input signal 115. This distributed approach is not inherently possible with the known prior art encoding methods, which require that all control information be located at the beginning of the block.

In an additional embodiment, illustrated in FIG. 3E, it is also within the scope of the present invention for the encoder 120 to implement an alternative byte ordering in the block-code encoded transmission signal 125 wherein all of the bytes containing control word information are positioned at the beginning of the block and the control bytes are then followed by the data bytes. Such an alternative byte ordering embodiment is illustrated in FIG. 3E, wherein the control word location map is stored in the first byte of the block-code encoded transmission signal 125 to indicate that there are control words positioned at bytes 1, 3, 5 and 7 of the decoded input signal 115. As the encoder 120 then maps the bytes of the decoded input signal 115 to the block-code encoded transmission signal 125, when the control words (C1, C2, C3, C4) are encountered in the input signal, instead of mapping the control codes and/or padding bits to the byte position in the block-code encoded transmission signal 125 according to the corresponding position of the control word in the decoded input signal 115, the encoder 120 maps the control codes into the bytes at the beginning of the block. As such, when the first control word (C1) is encountered by encoder 120 and the encoder determines that the following second control word (C2) is not the last control word to be mapped, the encoder maps the control code (c1) associated with the first control word (C1) to the first 4 bits of the $2^{nd}$ byte of the block and maps a 4-bit pad to the second 4 bits of the $2^{nd}$ byte. When the encoder then reaches the second control word (C2) and the encoder determines that the following third control word (C3) is not the last control word to be mapped, the encoder then maps the third control code (c2) to the first 4 bits of the $3^{rd}$ byte of the block and maps a 4-bit pad to the second 4 bits of the $3^{rd}$ byte. Upon encountering the third control word (C3) and determining that the following fourth control word (C4) is the last control word to be mapped, the encoder then maps the third control code (c3) to the first 4 bits of the $4^{th}$ byte of the block and maps the fourth control code (c4) to the second 4 bits of the 4$^{th}$ byte of the block. After all of the control codes have been mapped at the beginning of the block, the encoder then maps the data into bytes 5-8 to form the block-code encoded transmission signal 125.

In either the distributed embodiment of FIGS. 3A-3D or the embodiment wherein the control codes are positioned at the beginning of the block of FIG. 3E, the control word location map allows the receiver to properly restore the byte order as long as the block-code encoder 120 and the block-code decoder 130 use consistent conventions. However, grouping the control information at the beginning of the block increase the required latency at the receiver/decoder. For example, if the decoded input signal 115 contains a data word followed by seven control words and the block-code encoded transmission signal 125 is encoded to have all of the control information at the beginning of the block, the receiver 170 would not encounter the data word value until after the control information bytes. Hence, grouping the control information at the beginning of the block creates an inherent 7-byte minimum latency. Alternatively, if the control code information in the block is distributed based upon the locations of the corresponding control words in the decoded input signal 115, the receiver 170 only requires a single byte of latency in order to examine the first byte of the block for the control word location information.

The embodiments illustrated in FIG. 3A-FIG. 3E were exemplary of an encoder and associated encoding method for transcoding an 8 B/10 B block-code encoded input signal 105 to a 64 B/65 B block-code encoded transmission signal 125. The present invention additionally provides for the transcoding of a 64 B/66 B block-code encoded input signal to a 512 B/513 B block-code encoded transmission signal. Since, in accordance with ITU-T G.709, 512 B/513 B codes also utilize the first byte after the leading flag bit to begin communicating the control information, a similar method can be used for the transcoding of 512 B/513 B codes, wherein the primary difference between 8 B/10 B codes and the 64 B/66 B codes is that the control code type is communicated by the 10 B value of the 8 B/10 B code. In contrast, as shown with reference to FIG. 4, the format of a 64 B/66 B control block is such that the first 8-bit field communicates the type of control block and the remaining 56-bit field contains a mix of data words and control words, depending upon the control block type.

In particular, the first row of the table in FIG. 4 illustrates the byte settings when the decoded input signal 114 to be encoded contains only data blocks. In this case, following the setting of the control block indicator flag 400 to "0" to indicate that only data blocks will be mapped to the 512 B/513 B block-code, the encoder maps the data blocks (D1-D8) of the decoded input signal 115 to the block-code.

The second row of the table in FIG. 4 illustrates the byte settings when the incoming set of 64 B/66 B blocks contain a single control block and multiple data blocks. Accordingly, after setting the control block indicator flag 400 to "1" to indicate that the input signal contains one or more control blocks and the first bit of the first byte of the first word 405 to "0" to indicate that the input signal contains only a single control block, the control block location address of the single control block represented by a 3-bit address pointing to the original location of the single control block within the incoming set of 64 B/66 B blocks is mapped into the location address 445 at bits 2-4 of the first byte 405 and the single control block is mapped into the word as a 4-bit control code 450 into bits 5-8 of the first byte 405. The 56 bits of control information from the first control block are then mapped into the last 56 bits 460 of the first word in the 512 B/513 B code. Data blocks are then mapped into the following bytes to form the 512 B/513 B block-code encoded transmission signal.

The third row of the table in FIG. 4 illustrates the bytes setting when the block contains multiple control blocks. Accordingly, after setting the control block indicator flag 400 to "1" to indicate that the input signal contains one or more control blocks and the first bit of the first byte of the first word 405 to "1" to indicate that the input signal contains more than one control block, the control block location map 455 comprising a 7-bit explicit map of the control block locations in words 1-7 of the 64B/66B input signal is mapped into bits 2-8 of the first byte of the first word 405 and the 56 bits of control information from the first control block are then mapped into bytes 2-8 of the first word 465 in the 512B/513B code. Following the mapping of the control block location map 455 and the 56 bits of control information, the following bytes of words 2-8 contain data blocks or control blocks. The D/C bytes either contain data blocks if the 64B/65B input signal 105, after decoding, had a data block at that location or control codes, as defined in the mapping algorithm for the transcoding of the 8B/10B block to a 64B/65B block. It follows that each word containing a control code also contains 56 bits of information from a control block in the last 56 bits of that word location and the 56-bit control block information field of the first control block is always placed into the first word of the 513B code. The 56-bit control block information fields of the remaining control blocks are placed in order in the subsequent word locations containing control code information. Consequently, applying the invention to transcoding 64B/66B input signals into 512B/513B transmission signals requires maintaining the 56-bit information field of each control block in addition to its control code and location.

An exemplary embodiment of the present invention for transcoding an 64 B/65 B block into a 512 B/513 B block is illustrated in FIG. 5. As shown in FIG. 5, the input signal includes multiple control blocks comprising control information, wherein the control blocks are positioned at locations 1, 3 and 5 in the input signal 105 as indicated by the 7-bit control block location map, "1010100", which is mapped to bits 2-8 of the first byte of the first word of the 512 B/513 B transmission signal 125. The encoder 120 maps 56 bits of the first control block (C1) to bytes 2-8 of the first word. Byte 1 of the second word contains the first control code (cc 1) and padding bits (P) indicating that the second control block (C2) to be encountered by the encoder is not the last control code to be mapped to the block. The encoder then maps 56 bits of the second control block to bytes 2-8 of the second word of the block. The third word of the block contains 64 bits of data mapped from the data block (D1) of the input signal. The first byte of the forth word in the block contains the second control code (cc 2) and the third control code (cc 3) because the third control block (C3) is the last control block to be encoded. Bytes 2-8 of the fourth word contain 56 bits of the third control block (C3). The following words in the 513 B each contain 64 bits of data mapped from the remaining data block (D3-D5) of the input signal. As such, in the present invention, the 56-bit information fields of the 64 B/66 B codes are preserved in the mapping into the 512 B/513 B blocks.

Figure 6:
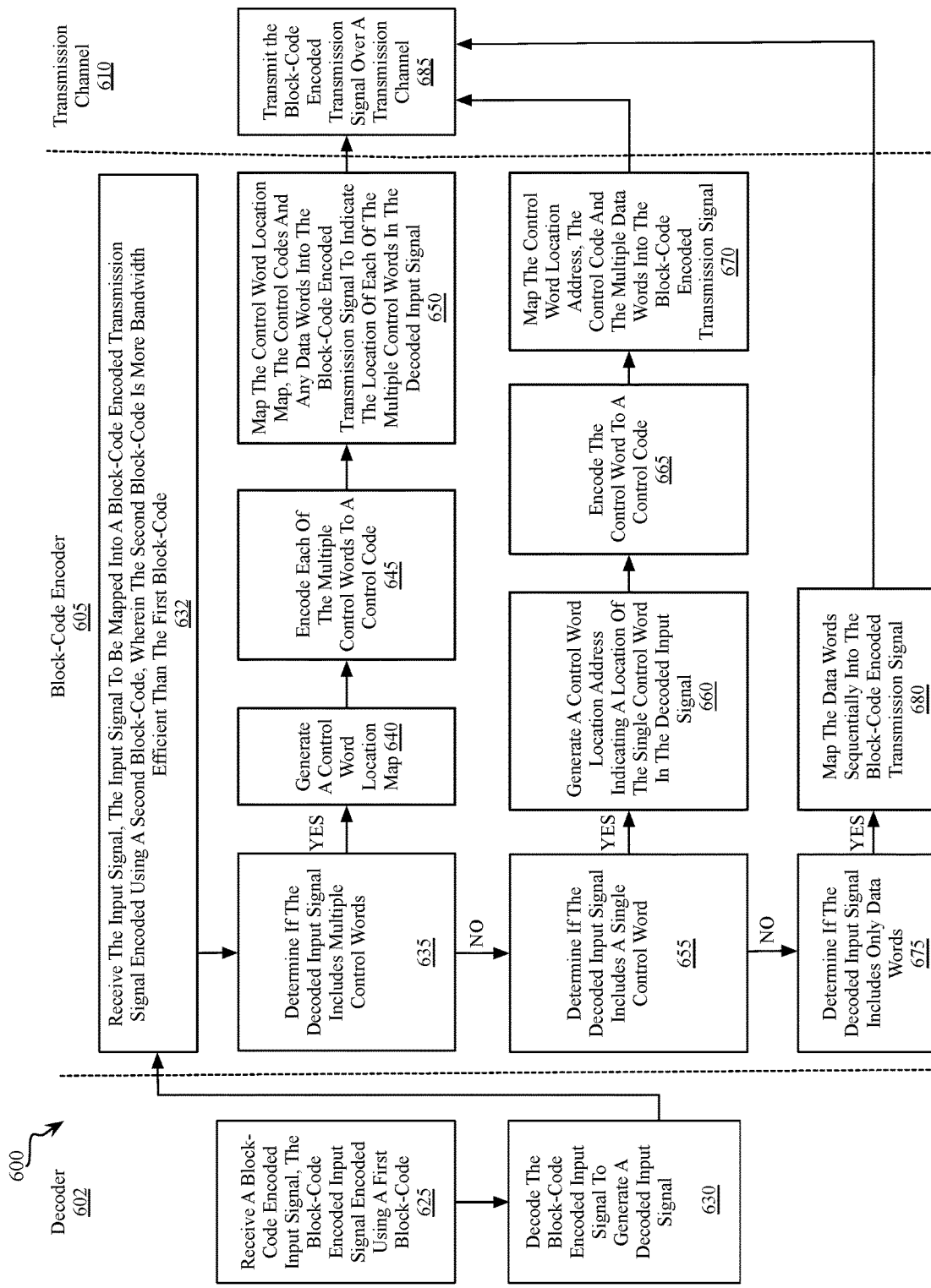
FIG. 6 is a swim diagram illustrating a method of transcoding, in accordance with an embodiment of the present invention.

FIG. 6 is a swim-diagram of an exemplary process 600 for transcoding a block-code encoded transmission signal 125. For example, the process 600 can be used by a user and implemented by a block-code encoder 605, to transcode a block-code encoded input signal received at a decoder 602 and encoded using a first block-code to a block-code encoded transmission signal encoded using a second block-code that is more bandwidth efficient than the first block-code for transmission over a transmission channel 610. FIG. 6 illustrates lanes for steps that can be performed by a decoder 602, a block-code encoder 605 and a transmission channel 610.

To generate a bandwidth efficient block-code encoded transmission signal at a block-code encoder 605, a block-code encoded input signal is first received at a decoder 602 (625). The block-code encoded input signal is encoded using a first block-code. After receiving the block-code encoded input signal, the decoder 600 decodes the block-code encoded input signal to generate a decoded input signal (630). The bits of the decoded input signal to be encoded into a block of the block-code encoded transmission signal will include multiple control words (either all control words, or multiple control words and one or more data words), multiple data words and a single control word or only data words. The decoder 600 then provides the decoded input signal to the block-code encoder 605.

The block-code encoder 605 of the present invention receives the decoded input signal from the decoder 602, wherein the received decoded input signal is to be mapped into a block-code encoded transmission signal encoded using a second block-code that is more bandwidth efficient than the first block-code (632). The block-code encoder 605 performs various steps to generate the block-code encoded transmission signal that is encoded using the second block-code that is more efficient that the first block-code. The block-code encoder 605 first determines if the input signal comprises multiple control words (635), a single control word (655) or multiple data words only (675). While the diagram illustrates the determination of the contents on the input signal performed in series, it is understood that the block-code encoder 605 may be programmed to makes the determination as to the contents of the input signal either sequentially or in parallel.

If the block-code encoder 605 determines that the input signal comprises multiple control words (635), the block-code encoder 605 then generates a control word location map (640). The block-code encoder 605 then encodes each of the multiple control words to a control code (645) and maps the control word location map, the control codes and any data words in the decoded input signal into the block-code encoded transmission signal (650) to indicate the location of each of the multiple control words in the input signal. Thus, when the decoded input signal does not include any data words, each of the control codes are mapped in to the block-code encoded transmission signal, and when the decoded input signal includes one or more data words, block encoder (605) maps the control word location map, the control codes and all of the data words into the block-code encoded transmission signal (650) to indicate the location of each of the multiple control words in the input signal.

Alternatively, if the block-code encoder 605 determines that the input signal comprises multiple data words and a single control word (655), the block-code encoder 605 then generates a control word location address indicating a location of the single control word in the input signal (660). The block-code encoder 605 then encodes the single control word to a control code (665) and maps the control word location address, the control code and the multiple data words into the block-code encoded transmission signal (670).

Additionally, if the block-code encoder 605 determines that the input signal comprises only data words (675), the block-code encoder 605 maps the data words sequentially into the block-code encoded transmission signal (680).

After the block-code encoder 605 has generated the block-code encoded transmission signal, the block-code encoder 605 provides the block-code encoded transmission signal to a transmission channel 610 in order to transmit the block-code encoded transmission signal over the transmission channel (685).

Figure 7:
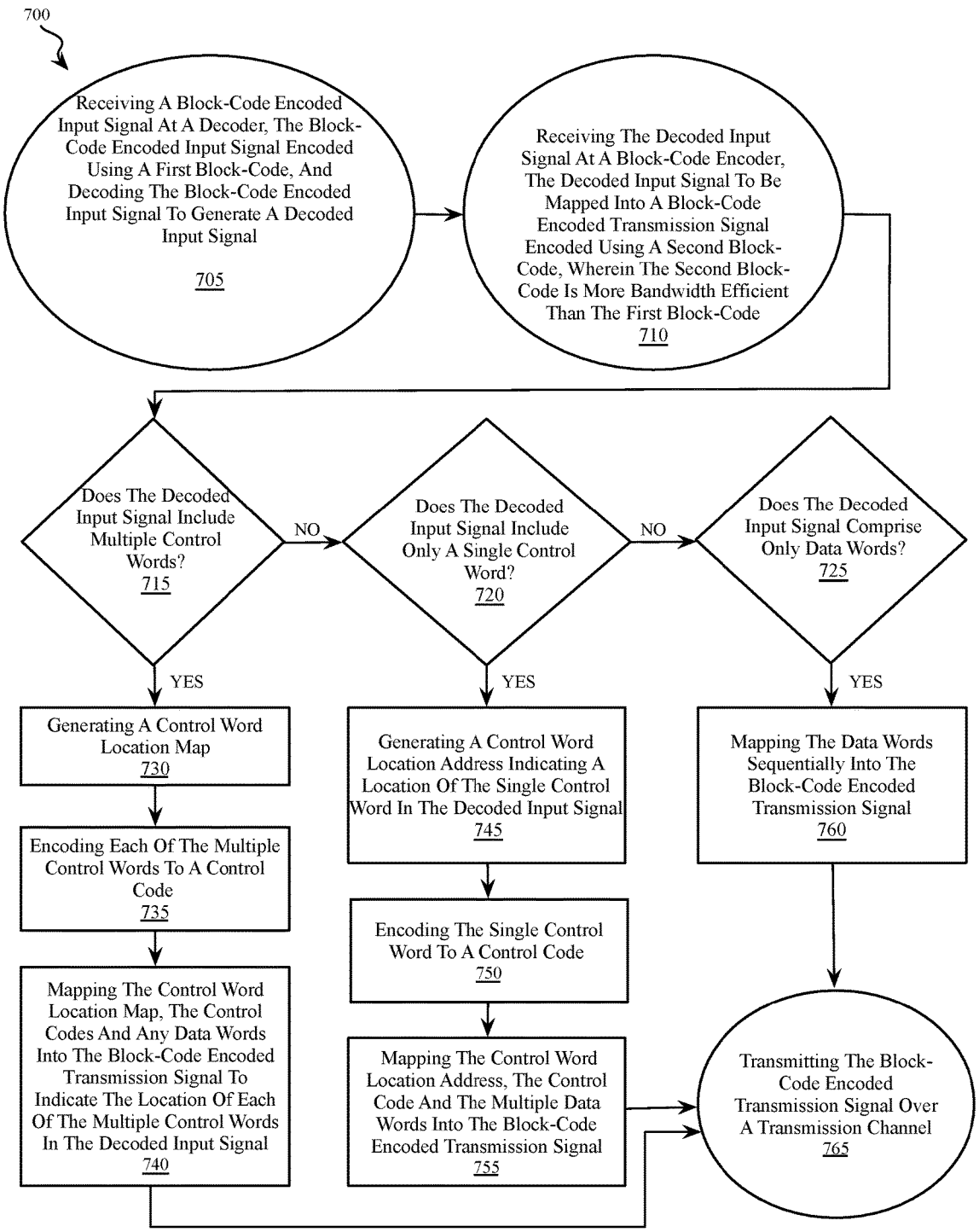
FIG. 7 is a flow diagram illustrating a method for transcoding, in accordance with an embodiment of the present invention.

FIG. 7 is a flow diagram of a method 700 for block-code transcoding. At operation 705, the method includes receiving a block-code encoded input signal at a decoder, the block-code encoded input signal encoded using a first block-code, and decoding the block-code encoded input signal to generate a decoded input signal. With reference to FIG. 1, in the present invention, the decoder 110 is configured for receiving the block-code encoded input signal 105 and for decoding the block-code encoded input signal to generate a decoded input signal 115 comprising multiple control words with zero to six data words, multiple data words and a single control word or multiple data words only.

At operation 710, the method includes receiving the decoded input signal at a block-code encoder, the decoded input signal to be mapped into a block-code encoded transmission signal encoded using a second block-code, wherein the second block-code is more bandwidth efficient than the first block-code. With reference to FIG. 1, in the present invention, the block-code encoder 120 is configured to receive the decoded input signal 115 to be mapped into a block-code encoded transmission signal encoded using the second block-code.

At operation 715, the method includes determining if the bits of the decoded input signal 115 to be mapped into a block of the block-code encoded transmission signal include multiple control words. At operation 720, the method includes determining if the input signal comprises multiple data words and a single control word. At operation 725, the method includes determining if the input signal comprises only data words. While operations 715, 720 and 725 are illustrated as being performed sequentially, it is within the scope of the present invention to perform one or more of operations 715, 720 and 725 in parallel. With reference to FIG. 1, in the present invention, the block-code encoder 120 is configured to determine if the input signal 115 comprises multiple control words, multiple data words and a single control word or only data words.

If at operation 715 it is determined that the bits of the decoded input signal 115 to be mapped into a block of the block-code encoded transmission signal include multiple control words, then at operation 730, the method includes generating a control word location map. Additionally, at operation 735, the method includes encoding each of the multiple control words to a control code. Following the generation of the control word location map at operation 730 and the encoding of the multiple control codes at operation 735, the method continues at operation 740, by mapping the control word location map, the multiple control codes and any data words to the block-code encoded transmission signal to indicate the location of each of the multiple control words in the decoded input signal.

With reference to FIG. 1, in the present invention, the block-code encoder 120 is configured to generate the control word location map, to determine the multiple control codes and to map the control word location map, the multiple control codes and any data words to the block-code encoded transmission signal 125. Thus, when the decoded input signal does not include any data words, each of the control codes are mapped in to the block-code encoded transmission signal, and when the decoded input signal includes one or more data words, block encoder (120) maps the control word location map, the control codes and all of the data words in the bits of the decoded input signal to be encoded into a block of the block-code encoded transmission signal (125).

Alternatively, if at operation 720, it is determined that the bits of the input signal to be mapped into a block of the block-code encoded transmission signal include multiple data words and a single control word, then at operation 745, the method includes generating a control word location address indicating a location of the single control word in the decoded input signal. Additionally, at operation 750, the method includes encoding the single control word to a control code. Following the generation of the control word location address at operation 745 and the encoding of the single control code at operation 750, the method continues at operation 755, by mapping the control word location address, the single control code and the multiple data words to the block-code encoded transmission signal. With reference to FIG. 1, in the present invention, the block-code encoder 120 is configured to generate the control word location address, to determine the single control code and to map the control word location address, the single control code and the data words to the block-code encoded transmission signal 125.

Additionally, if at operation 725, it is determined that the bits of the input signal to be mapped into a block of the block-code encoded transmission signal include only data words, then at operation 760, the method includes mapping the multiple data words sequentially into the block-code encoded transmission signal. With reference to FIG. 1, in the present invention, the block-code encoder 120 is configured to map the data words to the block-code encoded transmission signal 125.

At operation 765 the block-code encoded transmission signal 125 is then transmitted over a transmission channel. With reference to FIG. 1, in the present invention, the transmission channel 150 is configured to transmit the block-code encoded transmission signal 125 provided by the block-code encoder 120.

Figure 8:
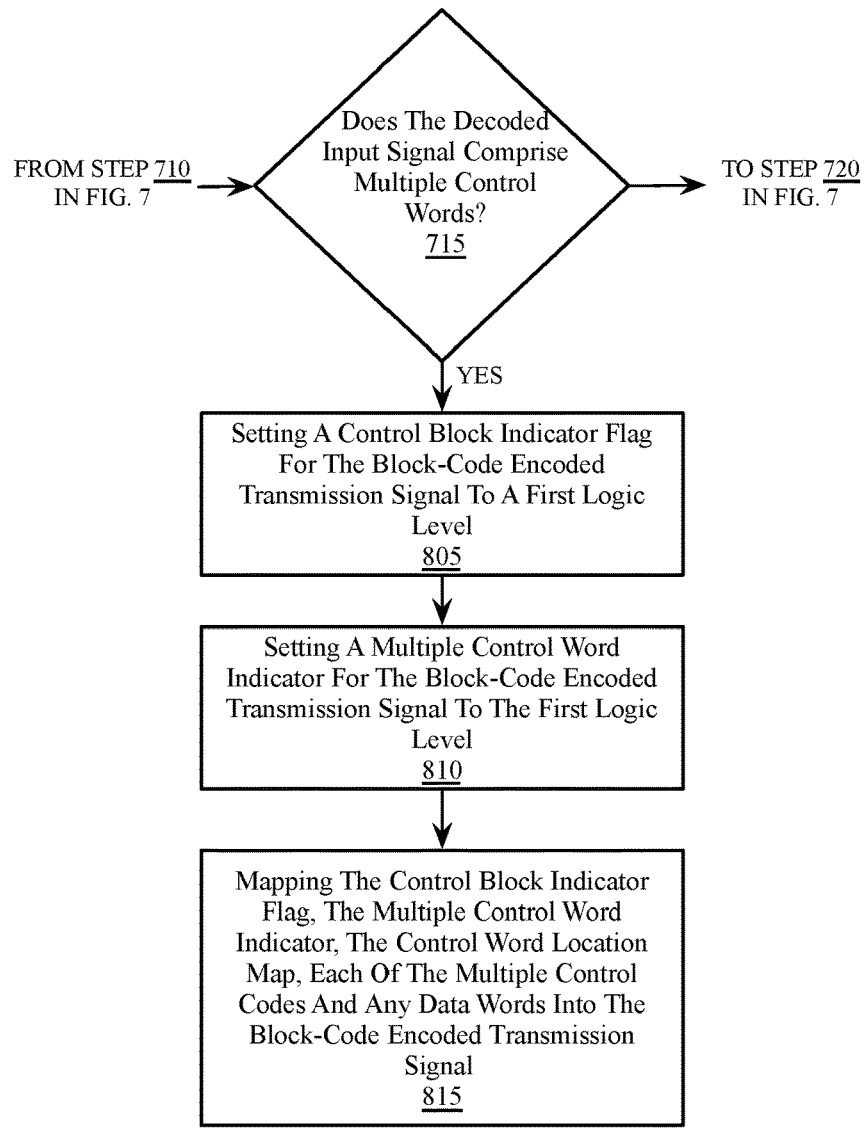
FIG. 8 is a flow diagram illustrating additional operations for transcoding an input signal comprising multiple control words, in accordance with an embodiment of the present invention.

FIG. 8 is a flow diagram 800 illustrating additional operations for block-code transcoding an input signal that comprises multiple control words, which has been as previously identified at operation 715 of FIG. 7. In addition to operation 730, wherein the method includes generating a control word location map and operation 735, wherein the method includes encoding each of the multiple control words to a control code, at operation 805, the method further includes setting a control block indicator flag for the block-code encoded transmission signal to a first logic level. At operation 810, the method further includes setting a multiple control word indicator for the block-code encoded transmission signal to the first logic level. In a particular embodiment, the control block indicator flag is set to a logic "1" to indicate that the input signal comprises at least one control word and the multiple control word indicator is set to a logic "1" to indicate that the input signal comprises more than one control word. Following the setting of the control block indicator flag and the multiple control word indicator, the method continues at operation 815, by mapping the control block indicator flag, the multiple control word indicator, the control word location map, each of the multiple control codes and any data words into the block-code encoded transmission signal. With reference to FIG. 1, in the present invention, the block-code encoder 120 is configured to set the control block indicator flag, to set the multiple control word indicator and to map the control block indicator flag, the multiple control word indicator, the control word location map, each of the multiple control codes and any data words into the block-code encoded transmission signal 125.

Figure 9:
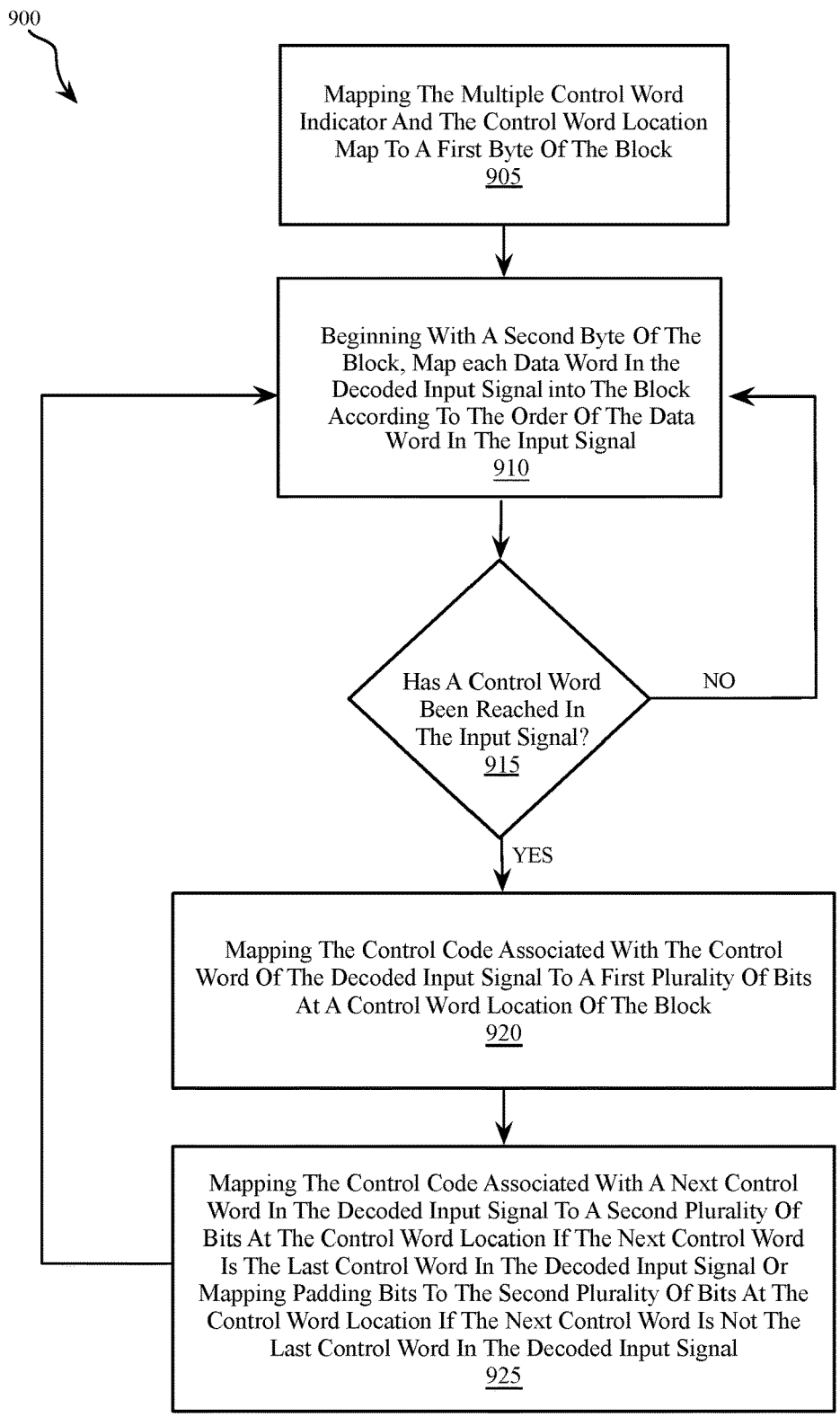
FIG. 9 is a flow diagram illustrating additional operations for mapping an input signal comprising multiple control words, in accordance with an embodiment of the present invention.

FIG. 9 is a flow diagram 900 illustrating additional operations for mapping the control block indicator flag, the multiple control word indicator, the control word location map, each of the multiple control codes and any data words into the block-code encoded transmission signal, as in operation 815 of FIG. 8. At operation 905, the method includes, for each block of the block-code encoded transmission signal, mapping the multiple control word indicator and the control word location map to a first byte of the block. At operation 910, the method further includes, mapping, beginning with a second byte of the block, each data word (in the bits of the decoded input symbol to be mapped into a block of the block-code encoded transmission symbol) into the block preferably according to the order of the data words in the input signal. During the mapping of the data words into the block, operation 915 is performed to determine if a control word has been reached. When a control word is encountered in the input signal, the method continues at operation 920 by mapping the control code associated with the control word of the input signal to a first plurality of bits at a control word location of the block. The method continues at operation 925 by mapping the control code associated with a next control word in the input signal to a second plurality of bits at the control word location if the next control word is the last control word in the input signal or by mapping padding bits to the second plurality of bits at the control word location if the next control word is not the last control word in the input signal. Operation 915 for mapping data words and operations 920 and 925 for mapping control codes and padding bits are repeated until the end of the input signal is reached and the block-code encoded transmission signal has been completed. With reference to FIG. 1, in the present invention, the block-code encoder 120 is configured to map the control block indicator flag, the multiple control word indicator, and any data words into the block. The block-code encoder 120 is further configured to determine when a control word has been reached and to map the control codes into the block-code encoded transmission signal 125.

Figure 10:
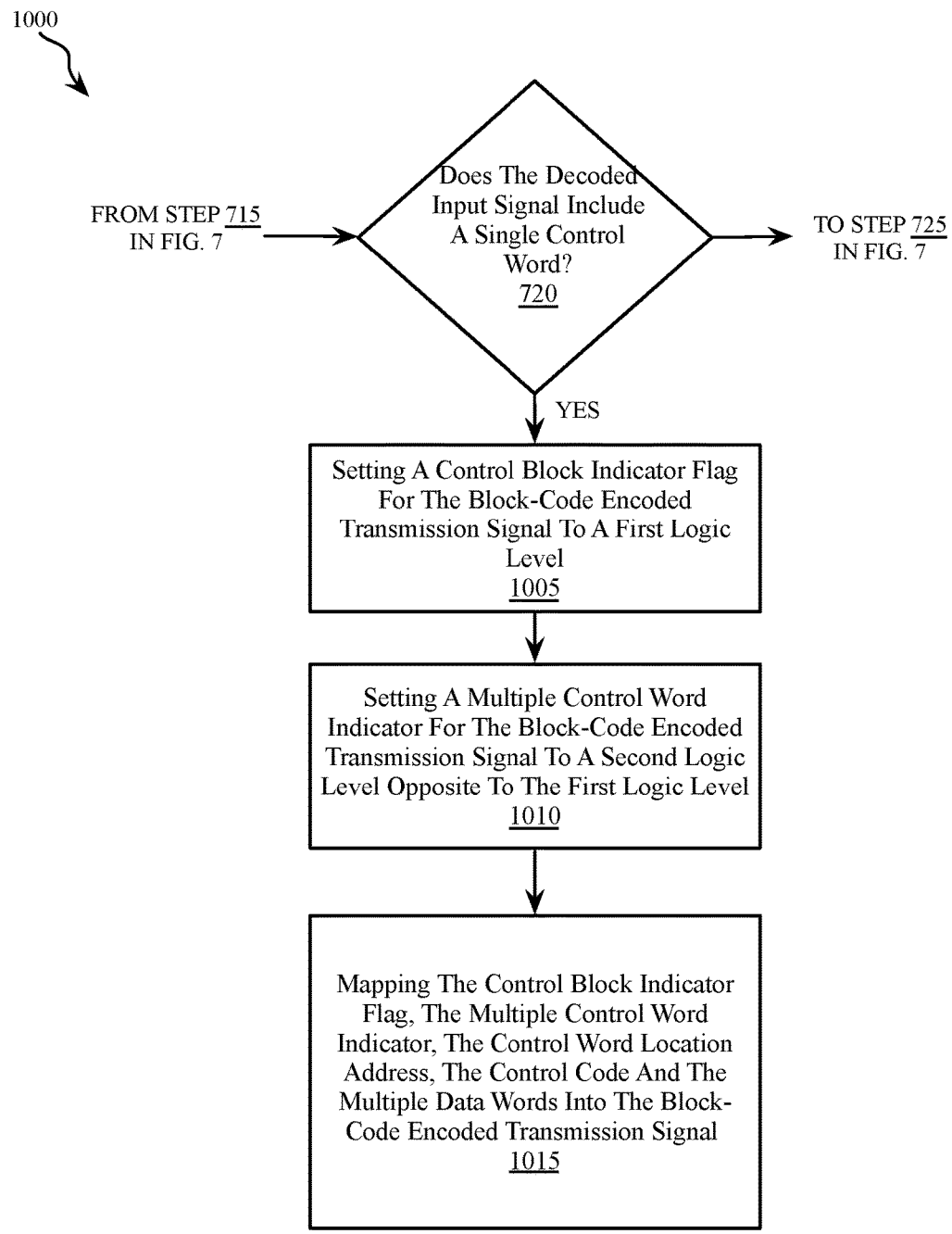
FIG. 10 is a flow diagram illustrating additional operations for transcoding an input signal comprising a single control word, in accordance with an embodiment of the present invention.

FIG. 10 is a flow diagram 1000 illustrating additional operations for block-code transcoding an input signal that comprises a single control word and multiple data words, which has been as previously identified by operation 720 of FIG. 7. In addition to operation 745, wherein the method includes generating a control word location address and operation 735, wherein the method includes encoding the single control word to a control code, at operation 1005, the method further includes setting a control block indicator flag for the block-code encoded transmission signal to a first logic level. At operation 1010, the method further comprises, setting a multiple control word indicator for the block-code encoded transmission signal to a second logic level opposite to the first logic level. In a particular embodiment, the control block indicator flag is set to a logic "1" to indicate that the input signal comprises at least one control word and the multiple control word indicator is set to a logic "0" to indicate that the input signal comprises a single control word. Following the setting of the control block indicator flag and the multiple control word indicator, the method continues at operation 1015, by mapping the control block indicator flag, the multiple control word indicator, the control word location address, the single control codes and the multiple data words into the block-code encoded transmission signal. With reference to FIG. 1, in the present invention, the block-code encoder 120 is configured to set the control block indicator flag, to set the multiple control word indicator and to map the control block indicator flag, the multiple control word indicator, the control word location address, the single control code and the multiple data words into the block-code encoded transmission signal 125.

Figure 11:
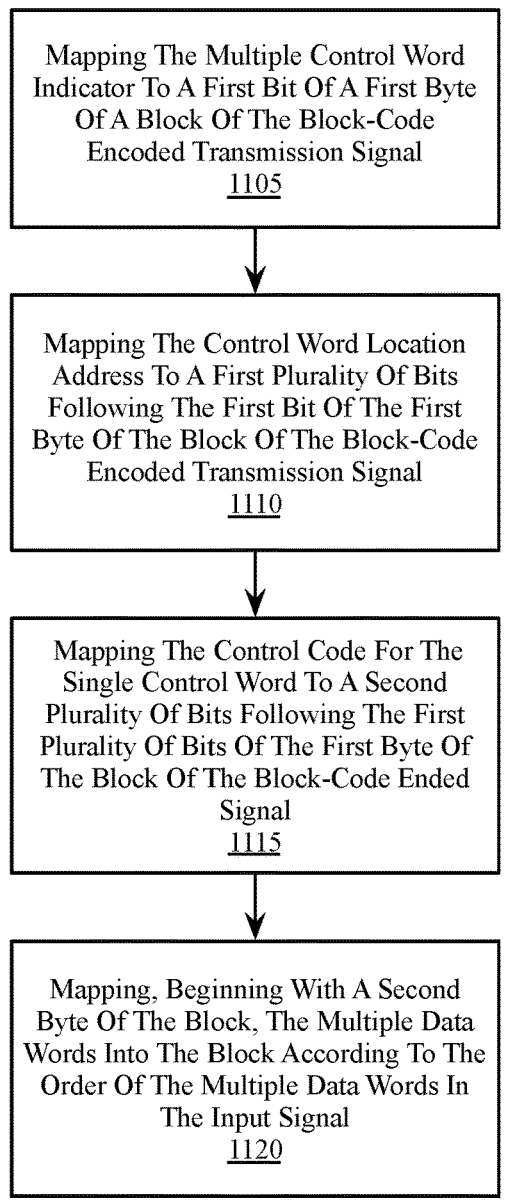
FIG. 11 is a flow diagram illustrating additional operations for mapping an input signal comprising a single control word, in accordance with an embodiment of the present invention.

FIG. 11 is a flow diagram 1100 illustrating additional operations for mapping the control block indicator flag, the multiple control word indicator, the control word location address, the single control code and the multiple data words into the block-code encoded transmission signal, as in operation 1015 of FIG. 10. At operation 1105, the method includes, for each block of the block-code encoded transmission signal, mapping the multiple control word indicator to a first bit of the first byte of the block. At operation 1110, the method further includes, mapping the control word location address to a first plurality of bits following the first bit of the first byte of the block. At operation 1115, the method further includes, mapping the control code for the single control word to a second plurality of bits following the first plurality of bits of the first byte of the block. At operation 1120, beginning with the second byte of the block, the method continues by mapping the multiple data words into the block according to the order of the multiple data words in the decoded input signal. With reference to FIG. 1, in the present invention, the block-code encoder 120 is configured to map the control block indicator flag, the multiple control word indicator, the single control code and the multiple data words into the block-code encoded transmission signal 125.

Figure 12:
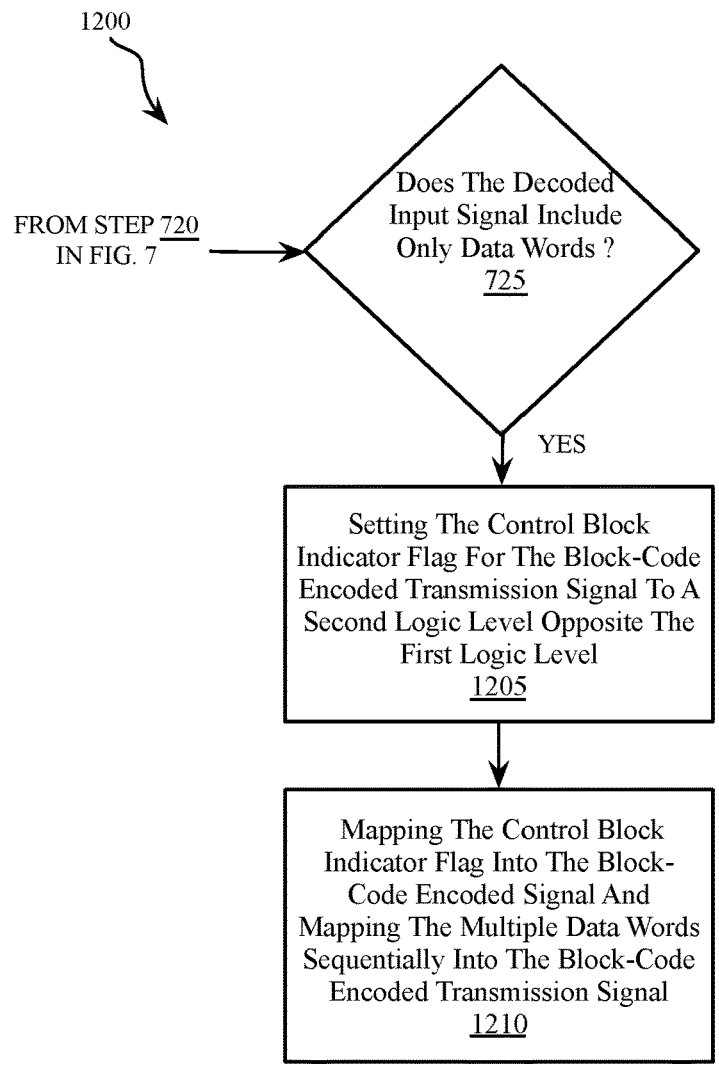
FIG. 12 is a flow diagram illustrating additional operations for mapping an input signal comprising multiple data words only, in accordance with an embodiment of the present invention.

FIG. 12 is a flow diagram 1200 illustrating additional operations for block-code transcoding an input signal that includes only data words, which has been as previously identified by operation 725 of FIG. 7. In addition to mapping the multiple data words sequentially into the block-code encoded transmission signal, as in operation 760 of FIG. 7, at operation 1205, the method further includes, setting the control block indicator flag for the block-code encoded transmission signal to a second logic level opposite the first logic level. In a particular embodiment, the control block indicator flag is set to a logic "0" to indicate that there are no control words in the input signal to be mapped to the block. At operation 1210, the method continues by mapping the control block indicator flag into the block-code encoded transmission signal and mapping the multiple data words sequentially into the block-code encoded transmission signal. With reference to FIG. 1, in the present invention, the block-code encoder 120 is configured to map the control block indicator flag and the multiple data words into the block-code encoded transmission signal 125.

The present invention allows for both 64 B/65 B and 512 B/513 B encoding in order to meet standard OTN bandwidth efficiency requirements. In addition, an explicit map of the control word locations in the client input signal is utilized instead of a chain of address locations for improved robustness. The control information encoding of the present invention does not require so many bits such that a block must contain fewer input signal data characters. As such, each of the encoded blocks of the present invention encode the same number of data characters. In addition, all encoded information in the resulting block-code transmission signal remains byte-aligned to allow for simplified data path processing.

In one embodiment, portions of the block-code encoder may be implemented in an integrated circuit as a single semiconductor die. Alternatively, the integrated circuit may include multiple semiconductor die that are electrically coupled together such as, for example, a multi-chip module that is packaged in a single integrated circuit package.

In various embodiments, portions of the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, a network processor, a microcontroller or general-purpose computer.

Unless specifically stated otherwise as apparent from the discussion, it is appreciated that throughout the description, discussions utilizing terms such as "receiving", "determining", "generating", "limiting", "sending", "counting", "classifying", or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present invention may be embodied on various computing platforms that perform actions responsive to software-based instructions. The following provides an antecedent basis for the information technology that may be utilized to enable the invention.

The method of the present invention may be stored on a computer readable medium which may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. However, as indicated above, due to circuit statutory subject matter restrictions, claims to this invention as a software product are those embodied in a non-transitory software medium such as a computer hard drive, flash-RAM, optical disk or the like.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object-oriented programming language such as Java, C#, C++, Visual Basic or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Further, for purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

I claim:

1. A method for block-code transcoding, the method comprising:
   receiving a block-code encoded input signal at a decoder, the block-code encoded input signal encoded using a first block-code, and decoding the block-code encoded input signal to generate a decoded input signal;
   receiving the decoded input signal at a block-code encoder, the decoded input signal to be mapped into a block-code encoded transmission signal encoded using a second block-code, wherein the second block-code is more bandwidth efficient than the first block-code;
   determining at the block-code encoder if the decoded input signal comprises multiple control words and if the decoded input signal comprises multiple control words, the method further comprising:
     generating a control word location map;
     encoding each of the multiple control words to generate multiple control codes;
     mapping the control word location map, each of the multiple control codes and each data word in the decoded input signal into the block-code encoded transmission signal to indicate a location of each of the multiple control words in the decoded input signal;
   determining at the block-code encoder if the decoded input signal comprises a single control word and if the decoded input signal comprises a single control word, the method further comprising:
     generating a control word location address indicating a location of the single control word in the decoded input signal;
     encoding the single control word to a control code;
     mapping the control word location address, the control code and each of the data words in the decoded input signal into the block-code encoded transmission signal; and
   determining at the block-code encoder if the decoded input signal comprises data words only and if the decoded input signal comprises data words only, the method further comprising mapping each of the data words in the decoded input signal into the block-code encoded transmission signal.

2. The method of claim 1, wherein if the decoded input signal comprises multiple control words and at least one data word, the method further comprising mapping each of the data words and each of the multiple control codes into the block-code encoded transmission signal at locations corresponding to the location of the data words and each of the multiple control words in the decoded input signal.

3. The method of claim 1, wherein if the decoded input signal comprises multiple control words and at least one data word, the method further comprising mapping each of the multiple control codes into a beginning of a block of the block-code encoded transmission signal and mapping each of the data words into the block following the multiple control codes, according to the order of the data words in the decoded input signal.

4. The method of claim 1, wherein if the decoded input signal comprises multiple control words, the method further comprising:
   setting a control block indicator flag bit for the block-code encoded transmission signal to a first logic level;
   setting a multiple control word indicator for the block-code encoded transmission signal to the first logic level;
   mapping the control block indicator flag bit into the block-code encoded transmission signal; and
   mapping the multiple control word indicator into the block-code encoded transmission signal.

5. The method of claim 1, wherein the control word location map explicitly indicates whether each word in the decoded input signal contains a data word or a control word, except for the last word of the decoded input signal, and the mapping each of the multiple control codes and each data word in the decoded input signal into the block-code encoded transmission signal implicitly indicates whether the last word of the decoded input signal contains a data word or a control word, wherein:

two control codes mapped to a byte of the block-code encoded transmission signal associated with the last control word location explicitly indicated by the control word location map implies that the last word of the decoded input signal is a control word; and two control codes mapped to a byte of the block-code encoded transmission signal associated with the next to last control word location explicitly indicated by the control word location map implies that the last word of the decoded input signal is a data word.

6. The method of claim 1, wherein if the decoded input signal comprises multiple data words and a single control word, the method further comprising:

setting a control block indicator flag bit of the block-code encoded transmission signal to a first logic level;

setting the multiple control word indicator to a second logic level opposite to the first logic level;

mapping the control block indicator flag bit into the block-code encoded transmission signal; and mapping the multiple control word indicator into the block-code encoded transmission signal.

7. The method of claim 1, wherein if the decoded input signal comprises multiple data words only, the method further comprising:

setting the control block indicator flag for the block-code encoded transmission signal to a second logic level opposite the first logic level; and mapping the control block indicator flag into the block-code encoded transmission signal.

8. The method of claim 1, wherein the first block-code is an 8B/10B block-code and the second block-code is a 64B/65B block-code.

9. The method of claim 1, wherein the first block-code is a 64B/66B block-code and the second block-code is a 512B/513B block-code.

10. The method of claim 1, wherein, if the decoded input signal comprises multiple control words and does not include any data words, the mapping the control word location map, each of the multiple control codes and each data word in the decoded input signal into the block-code encoded transmission signal to indicate a location of each of the multiple control words in the decoded input signal further comprises mapping the control word location map and each of the multiple control codes into the block-code encoded transmission signal to indicate a location of each of the multiple control words in the decoded input signal.

11. The method of claim 4, wherein mapping the multiple control word indicator, the control word location map, each of the multiple control codes and each data word in the decoded input signal into the block-code encoded transmission signal further comprises, for each block of the block-code encoded transmission signal, wherein each block comprises a plurality of bytes:

mapping the multiple control word indicator and the control word location map to a first byte of the block;

mapping, beginning with a second byte of the block, each data word in the decoded input signal into the block according to the order of the data word in the decoded input signal until a control word is reached in the decoded input signal, and when a control word is reached:

mapping the control code associated with the control word of the decoded input signal to a first plurality of bits at a control word location of the block; and mapping the control code associated with a next control word in the decoded input signal to a second plurality of bits at the control word location if the next control word is the last control word in the decoded input signal or mapping padding bits to the second plurality of bits of the byte if the next control word is not the last control word in the decoded input signal.

12. The method of claim 6, wherein mapping the multiple control word indicator, the control word location address, the control code for the single control word and the multiple data words into the block-code encoded transmission signal further comprises, for each block of the block-encoded transmission signal, wherein each block comprises a plurality of bytes:

mapping the multiple control word indicator to a first bit of a first byte of a block of the block-code encoded transmission signal;

mapping the control word location address to a first plurality of bits following the first bit of the first byte of the block of the block-code encoded transmission signal;

mapping the control code for the single control word to a second plurality of bits following the first plurality of bits of the first byte of the block of the block-code encoded transmission signal; and mapping, beginning with a second byte of the block, the multiple data words into the block according to the order of the multiple data words in the decoded input signal.

13. A method for block-code transcoding, the method, the method comprising:

receiving a block-code encoded input signal at a decoder, the block-code encoded input signal encoded using a first block-code, and decoding the block-code encoded input signal to generate a decoded input signal;

receiving the decoded input signal at a block-code encoder, the decoded input signal to be mapped into a block-code encoded transmission signal encoded using a second block-code, wherein the second block-code is more bandwidth efficient than the first block-code;

determining at the block-code encoder if the decoded input signal comprises multiple control words and if the decoded input signal comprises multiple control words, the method further comprising:

setting a control block indicator flag bit for the block-code encoded transmission signal to a first logic level;

setting a multiple control word indicator for the block-code encoded transmission signal to the first logic level;

generating a control word location map;

encoding each of the multiple control words to generate multiple control codes;

mapping the control block indicator flag bit, the multiple control word indicator, the control word location map, each of the multiple control codes and each data word in the decoded input signal into the block-code encoded transmission signal to indicate a location of each of the multiple control words in the decoded input signal;

determining at the block-code encoder if the decoded input signal comprises multiple data words and a single control word and if the decoded input signal comprises multiple data words and a single control word, the method further comprising:

setting a control block indicator flag bit of the block-code encoded transmission signal to a first logic level;

setting the multiple control word indicator to a second logic level opposite to the first logic level;

generating a control word location address indicating a location of the single control word in the decoded input signal;

encoding the single control word to a control code;

mapping the control block indicator flag bit, the multiple control word indicator, the control word location address, the control code and the multiple data words into the second block-code encoded transmission signal;

determining at the block-code encoder if the decoded input signal comprises data words only and if the decoded input signal comprises data words only, the method further comprising:

setting the control block indicator flag for the block-code encoded transmission signal to a second logic level opposite the first logic level;

mapping the control block indicator flag and the data words sequentially into the block-code encoded transmission signal; and transmitting the block-code encoded transmission signal from a transmitter.

14. A system for block-code transcoding, the system comprising:

a block-code encoder including a circuit configured to receive an input signal, the block-code encoder configured to:

determine if the received input signal comprises multiple control words and if the received input signal comprises multiple control words, the block-code encoder further configured to generate a control word location map, encode each of the multiple control words to generate multiple control codes and, map the control word location map, each of the multiple control codes and each data word in the input signal into a block-code encoded transmission signal to indicate a location of each of the multiple control words in the input signal;

determine if the input signal comprises a single control word and if the input signal comprises a single control word, the block-code encoder further configured to generate a control word location address indicating a location of the single control word in the decoded input signal, encode the single control word to a control code, and map the control word location address, the control code and each of the data words in the input signal into the block-code encoded transmission signal; and determine if the input signal comprises only data words and if the input signal comprises only data words, the block-code encoder further configured to map each of the data words in the input signal sequentially into the block-code encoded transmission signal; and a transmitter coupled to the encoder, the transmitter configured to transmit the block-code encoded transmission signal.

15. The system of claim 14, further comprising a decoder coupled to the block-code encoder, the decoder configured for receiving a block-code encoded input signal encoded using a first block-code, wherein the decoder is configured for decoding the block-code encoded input signal to generate the input signal for the block-code encoder.

16. The system of claim 14, wherein if the input signal comprises multiple control words and at least one data word, the block-code encoder is further configured to map each of the data words in the input signal and each of the multiple control codes into the block-code encoded transmission signal at locations corresponding to the location of each of the data words and each of the multiple control words in the input signal.

17. The system of claim 14, wherein if the input signal comprises multiple control words and at least one data word, the block-code encoder is further configured to map each of the multiple control codes into a beginning of a block of the block-code encoded transmission signal and map each of the data words into the block following the multiple control codes, according to the order of the data words in the input signal.

18. The system of claim 14, wherein if the input signal comprises multiple control words, the block-code encoder is further configured to, for each block of the block-code encoded transmission signal:

set a control block indicator flag bit for the block of the block-code encoded transmission signal to a first logic level;

set a multiple control word indicator for the block of the block-code encoded transmission signal to the first logic level;

map the multiple control word indicator and the control word location map to a first byte of the block of the block-code encoded transmission signal;

map, beginning with a second byte of the block, the data words into the block according to the order of the data words in the input signal until a control word is reached in the input signal, and when a control word is reached;

map the control code associated with the control word of the input signal to a first plurality of bits at a control word location of the block; and map the control code associated with a next control word in the input signal to a second plurality of bits at the control word location if the next control word is the last control word in the input signal or map padding bits to the second plurality of bits at the control word location if the next control word is not the last control word in the input signal.

19. The system of claim 14, wherein the control word location map explicitly indicates whether each word in the input signal contains a data word or a control word, except for the last word of the input signal, and the mapping of each of the multiple control codes and the multiple data words into the block-code encoded transmission signal implicitly indicates whether the last word of the input signal contains a data word or a control word, wherein:

two control codes mapped to a byte of the block-code encoded transmission signal associated with the last control word location explicitly indicated by the control word location map implies that the last word of the input signal is a control word; and two control codes mapped to a byte of the block-code encoded transmission signal associated with the next to last control word location explicitly indicated by the control word location map implies that the last word of the input signal is a data word.

20. An integrated circuit device comprising:

a circuit configured to receive a block-code encoded input signal encoded using a first block-code;

a decoder coupled to the circuit configured to receive the block-code encoded input signal, the decoder configured for decoding the block-code encoded input signal;

a block-code encoder coupled to the decoder, the block-code encoder configured to:

determine if the decoded input signal comprises multiple control words and if the decoded input signal comprises multiple control words, the block-code encoder further configured to:

generate a control word location map, encode each of the multiple control words to generate multiple control codes, and map the control word location map, each of the multiple control codes and each data word in the input signal into a block-code encoded transmission signal to indicate a location of each of the multiple control words in the decoded input signal;

determine if the decoded input signal comprises a single control word and if the decoded input signal comprises a single control word, the block-code encoder further configured to:

generate a control word location address indicating a location of the single control word in the decoded input signal, encode the single control word to a control code, and map the control word location address, the control code and each of the data words in the decoded input signal into the block-code encoded transmission signal; and determine if the decoded input signal comprises only data words and if the decoded input signal comprises only data words, the block-code encoder further configured to map each of the data words in the decoded input signal sequentially into the block-code encoded transmission signal; and a transmitter coupled to the encoder, the transmitter including a circuit configured to transmit the block-code encoded transmission signal.

* * * * *